United States Patent
Na et al.

(10) Patent No.: US 12,197,764 B2
(45) Date of Patent: Jan. 14, 2025

(54) MEMORY SYSTEM AND OPERATING METHOD THEREOF

(71) Applicant: SK hynix Inc., Icheon-si (KR)

(72) Inventors: Hyeong Ju Na, Icheon-si (KR); Seong Bae Jeon, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/391,480

(22) Filed: Aug. 2, 2021

(65) Prior Publication Data

US 2022/0300187 A1 Sep. 22, 2022

(30) Foreign Application Priority Data

Mar. 18, 2021 (KR) .......................... 10-2021-0035251

(51) Int. Cl.
*G06F 3/06* (2006.01)

(52) U.S. Cl.
CPC .......... *G06F 3/0653* (2013.01); *G06F 3/0616* (2013.01); *G06F 3/064* (2013.01); *G06F 3/0679* (2013.01)

(58) Field of Classification Search
None
See application file for complete search history.

(56) References Cited

U.S. PATENT DOCUMENTS

| | | | | |
|---|---|---|---|---|
| 2012/0284453 A1* | 11/2012 | Hashimoto | ......... | G06F 12/0804 711/E12.008 |
| 2016/0117216 A1* | 4/2016 | Muchherla | ............. | G11C 16/10 714/6.11 |
| 2016/0188219 A1* | 6/2016 | Peterson | ............. | G06F 12/0246 711/103 |
| 2017/0003896 A1* | 1/2017 | Seppanen | ............. | G06F 3/0658 |
| 2017/0046097 A1* | 2/2017 | Jayaraman | ............ | G06F 3/0614 |
| 2017/0168716 A1* | 6/2017 | Shaharabany | ........ | G06F 3/0679 |
| 2017/0255403 A1* | 9/2017 | Sharon | ............... | G11C 16/3431 |
| 2020/0004458 A1* | 1/2020 | Cerafogli | ................ | G11C 7/04 |

FOREIGN PATENT DOCUMENTS

| | | |
|---|---|---|
| CN | 103403691 A | 11/2013 |
| CN | 109074831 A | 12/2018 |
| KR | 20190122057 A | 10/2019 |
| KR | 20200031852 A | 3/2020 |

OTHER PUBLICATIONS

Office Action mailed May 29, 2024 in Chinese Patent Application No. 202111020212.2, 8 pages.

* cited by examiner

*Primary Examiner* — Yaima Rigol
*Assistant Examiner* — Alexander J Yoon
(74) *Attorney, Agent, or Firm* — Perkins Coie LLP

(57) ABSTRACT

A memory system is provided to include a memory device and a memory controller. The memory controller is configured to set, for a first memory die, a state check memory block that is used to check a state of data stored in memory blocks included in the first memory die, and the memory controller is further configured to manage, for each of a plurality of temperature periods that are predetermined, (1) a state check page corresponding to a temperature period and included in the state check memory block and (2) a program memory block list indicating information on certain memory blocks programmed at a time that a temperature of the memory system falls within the temperature period.

18 Claims, 18 Drawing Sheets

Determine whether temperature of memory system has initially entered first temperature period —S1710

Program data in reference page such that no memory cell in erased state exists among memory cells corresponding to reference page —S1720

MEMORY SYSTEM AND OPERATING METHOD THEREOF

CROSS-REFERENCE TO RELATED APPLICATION

This patent document claims the priority and benefits of Korean patent application number 10-2021-0035251 filed on Mar. 18, 2021, which is incorporated herein by reference in its entirety.

TECHNICAL FIELD

Various embodiments of the disclosed technology generally relate to a memory system and an operating method thereof.

BACKGROUND

A memory system includes a data storage device that stores data based on a request from a host, such as a computer, servers, a smartphone, a tablet PC, or other electronic devices. The examples of the memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

The probability for an error to occur in data stored in a memory device increases as a time elapses since the data is stored in the memory device. Thus, a memory system needs to check whether an error has occurred in the data stored in the memory device, by checking a state of the corresponding data.

SUMMARY

Various embodiments of the disclosed technology are directed to a memory system and an operating method thereof, capable of quickly detecting whether an error has occurred in stored data, in various temperature environments.

Various embodiments of the disclosed technology are directed to a memory system and an operating method thereof, capable of preventing a problem caused by degradation in reliability due to a temperature change, by checking in advance whether an error has occurred in data programmed under a specific temperature condition.

In one aspect, embodiments of the disclosed technology may provide a memory system including: a memory device including a plurality of memory dies each memory die including a plurality of memory blocks configured to store data; and a memory controller coupled to communicate with the memory device, and configured to control the memory device.

The memory controller may be configured to set, for a first memory die included in the plurality of memory dies, a state check memory block that is used to check a state of data stored in memory blocks included in the first memory die.

The memory controller may manage, for each of a plurality of temperature periods that are predetermined, (1) a state check page corresponding to a temperature period and included in the state check memory block and (2) a program memory block list indicating information on certain memory blocks programmed at a time that a temperature of the memory system falls within the temperature period.

The memory controller may program data, in response to the determination that a temperature of the memory system has initially entered the temperature period, in the state check page such that the status check page is free of a memory cell that is in an erased state.

In another aspect, embodiments of the disclosed technology may provide a method for operating a memory system including a memory device.

The method for operating a memory system may include setting, for a first memory die that is one of a plurality of memory dies included in the memory device, a state check memory block that is used to check a state of data stored in memory blocks included in the first memory die.

In addition, the method for operating a memory system may include managing, for each of a plurality of temperature periods that are predetermined, (1) a state check page corresponding to a temperature period and included in the state check memory block and (2) a program memory block list indicating information on certain memory blocks programmed at a time that a temperature of the memory system falls within the temperature period.

The managing may include determining whether a temperature of the memory system has initially entered the temperature period; and programming data in the state check page such that the state check page is free of a memory cell that is in an erased state.

According to embodiments of the disclosed technology, it is possible to quickly detect, in various temperature environments, whether an error has occurred in stored data and check in advance whether an error has occurred in data programmed under a specific temperature condition, thereby preventing a problem caused by degradation in reliability due to a temperature change.

BRIEF DESCRIPTION OF THE DRAWINGS

FIG. 17 is a diagram showing an example of operation of managing a state check page and a program memory block list for each of a plurality of temperature periods.

DETAILED DESCRIPTION

Hereinafter, examples of embodiments of the disclosed technology are described in detail with reference to the accompanying drawings.

Figure 1:
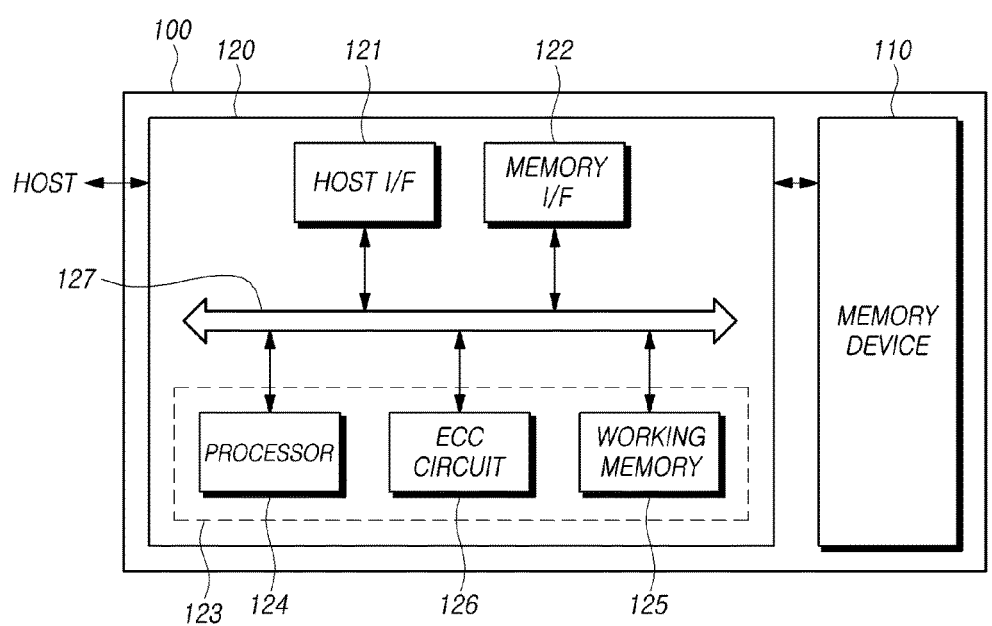
FIG. 1 is a schematic diagram illustrating a configuration of a memory system based on an embodiment of the disclosed technology.

FIG. 1 is a diagram illustrating a schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 or others.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this patent document, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
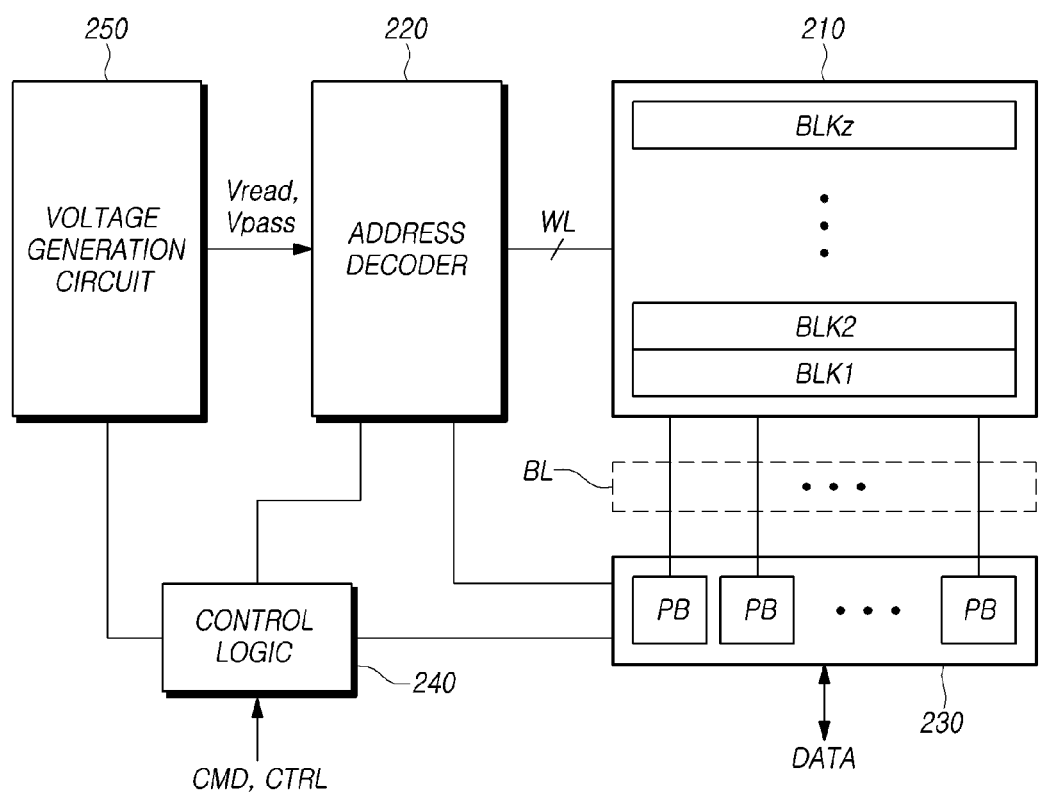
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
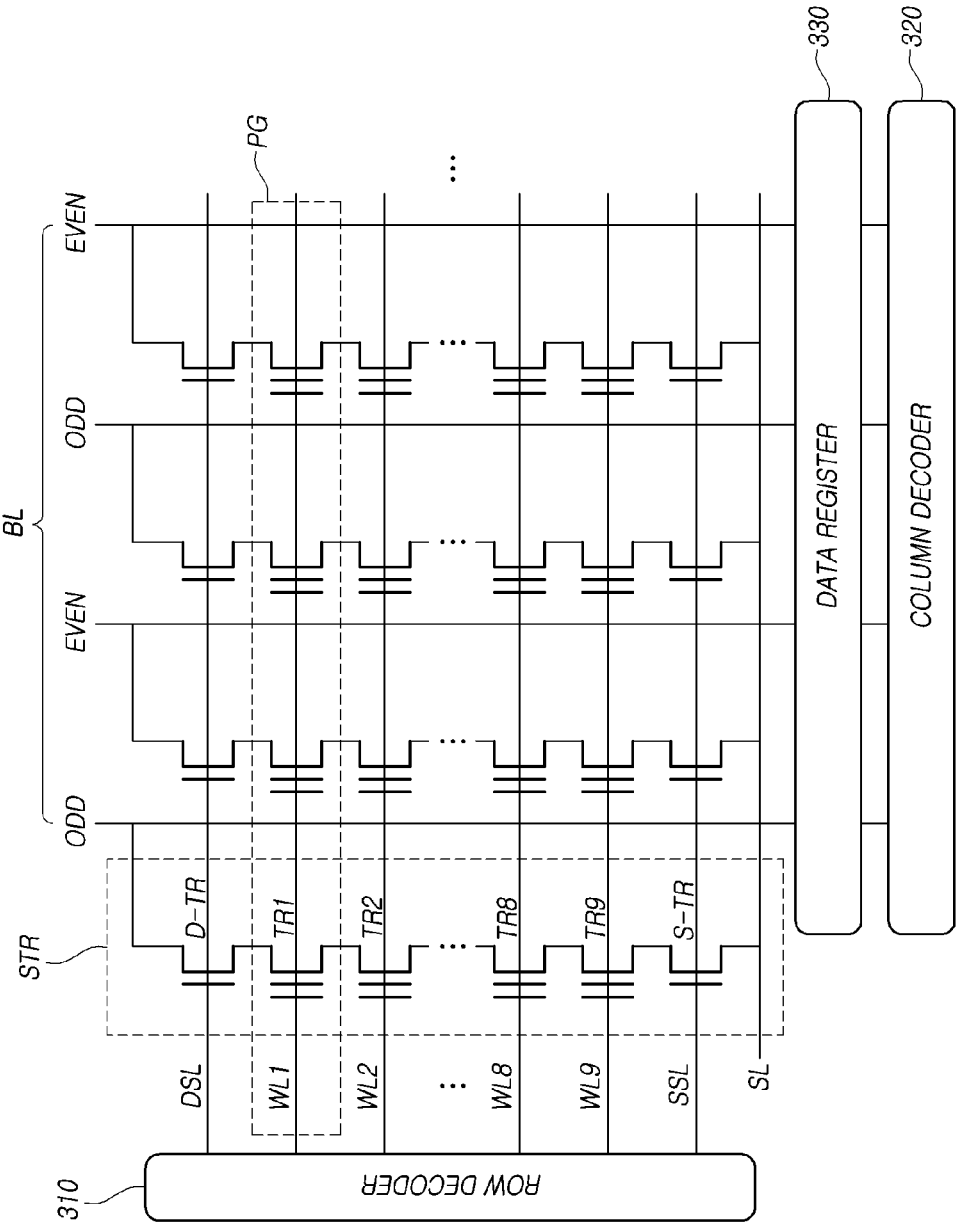
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
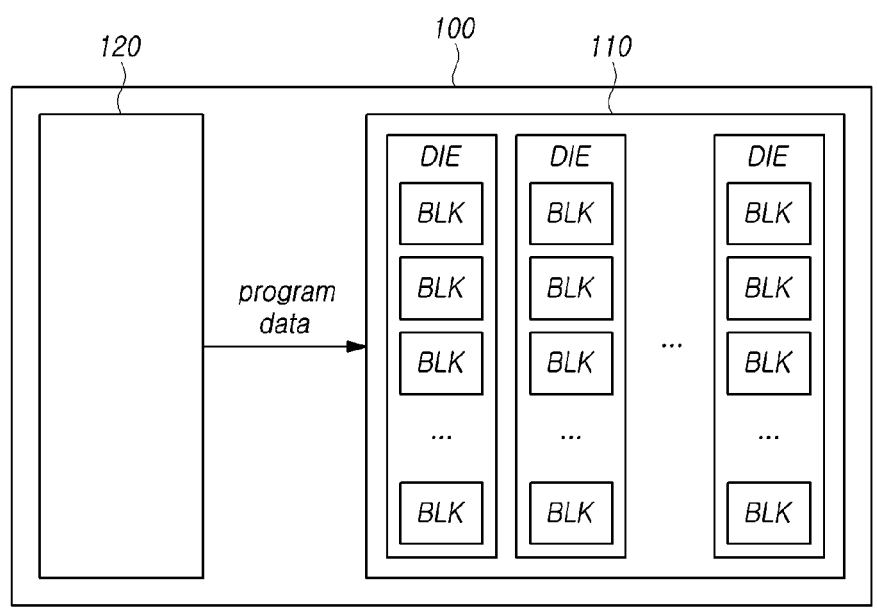
FIG. 4 is a diagram illustrating a schematic structure of a memory system based on an embodiment of the disclosed technology.

FIG. 4 is a diagram illustrating a schematic structure of a memory system 100 based on an embodiment of the disclosed technology.

Referring to FIG. 4, the memory system 100 may include a memory device 110 and a memory controller 120. The memory device 110 of the memory system 100 may include a plurality of memory dies DIE. Each of the plurality of memory dies DIE may include a plurality of memory blocks BLK.

The memory controller 120 of the memory system 100 may request the memory device 110 to program data to a memory block BLK included in any one of the plurality of memory dies DIE included in the memory device 110.

A first memory die DIE_1 will be described in more details as one example of the plurality of memory dies DIE.

Figure 5:
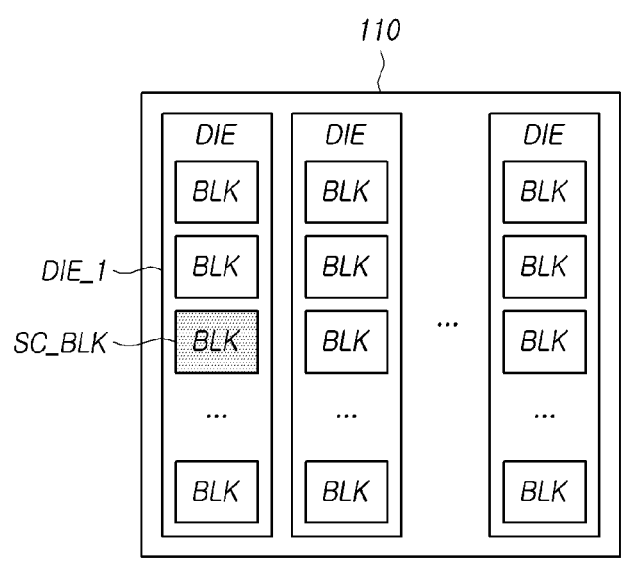
FIG. 5 is a diagram illustrating a state check memory block of a first memory die based on an embodiment of the disclosed technology.

FIG. 5 is a diagram illustrating a state check memory block SC_BLK of the first memory die DIE_1 based on an embodiment of the disclosed technology.

Referring to FIG. 5, the memory controller 120 of the memory system 100 may select or set the state check memory block SC_BLK for the first memory die DIE_1 among the plurality of memory dies DIE included in the memory device 110.

The state check memory block SC_BLK is a memory block which is used to check states of data stored in the memory blocks BLK included in the first memory die DIE_1. For example, the state check memory block SC_BLK may check whether an error has occurred in data stored in the memory blocks BLK included in the first memory die DIE_1. The memory controller 120 may select the state check memory block SC_BLK that is one of the memory blocks BLK included in the first memory die DIE_1.

The following section describes why the memory controller 120 of the memory system 100 uses the separate state check memory block SC_BLK to check states of data stored in the memory blocks BLK included in the first memory die DIE_1.

A retention time for which the memory system 100 retains data without an error may be determined by various factors such environmental and other factors, (e.g., a temperature, a power-on time, etc.). One or more of such factors may change during the operation of the memory system. For example, the memory system 100 may not always be in a power-on state or the temperature of the memory system 100 may vary over time. It can be difficult for the memory system 100 to catch and reflect such a change in real time.

Thus, the memory system 100 may determine a state of data stored in the memory device 110 by actually reading the data stored in the memory device. In this case, the memory system 100 may need to determine from which memory block BLK among the memory blocks included in the memory device 110 the data is to be read. The memory system 100 may check probabilities that an error occurs in data stored in each of memory blocks in the memory device 110 and select a memory block with a high possibility for an error occurrence among the memory blocks BLK included in the memory device 110. By using the memory block with a high possibility that an error occurs to determine the state of the data stored in the memory device 110 can allow the memory system 100 to detect an error occurrence more quickly.

To check a state of data included in the first memory die DIE_1 of the memory device 110, the memory system 100 may determine first from which memory block BLK the data is to be read by using the state check memory block SC_BLK.

In some implementations, the memory controller 120 may use the state check memory block SC_BLK, included in the first memory die DIE_1, for other memory dies in the memory device 110. In some other implementations, the memory controller 120 may set a separate state check memory block for each memory die DIE of the memory dies in the memory device 110.

In some implementations, when a specific condition is satisfied, the memory controller 120 may change, for the first memory die DIE_1, the state check memory block SC_BLK to another memory block included in the first memory die DIE_1. For example, when an erase/program count of a current state check memory block SC_BLK increases to be equal to or greater than a predetermined threshold count value, the memory controller 120 may change the state check memory block SC_BLK to another memory block included in the first memory die DIE_1. The memory controller 120 can avoid or reduce the degradation of the state check memory block SC_BLK occurring due to the repeated erase/program operations.

Hereinafter, an example of a detailed method is described to illustrate how the memory system 100 checks a state of data stored in the first memory die DIE_1 based on the state check memory block SC_BLK of the first memory die DIE_1 and an additional data structure.

Figure 6:
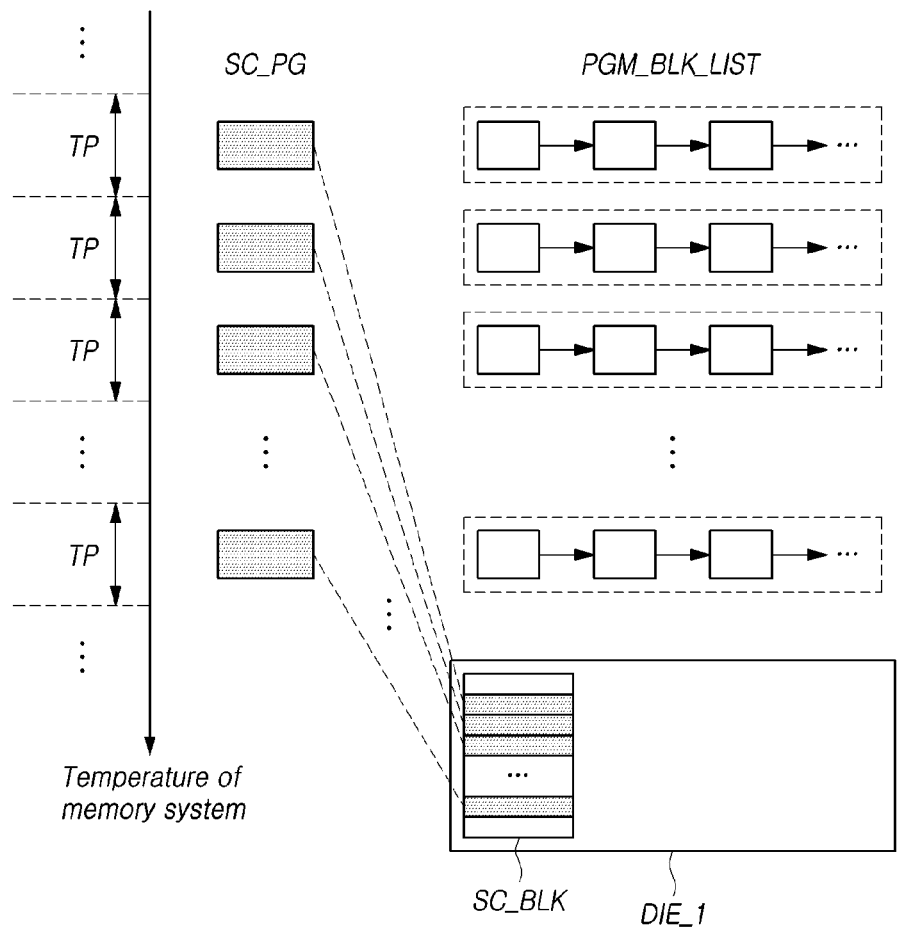
FIG. 6 is a diagram illustrating an operation of managing a state check page and a program memory block list for each of a plurality of temperature periods based on an embodiment of the disclosed technology.

FIG. 6 is a diagram illustrating an operation in which a memory system 100 manages a state check page SC_PG and a program memory block list PGM_BLK_LIST for each of a plurality of temperature periods TP based on an embodiment of the disclosed technology.

Referring to FIG. 6, the memory controller 120 of the memory system 100 may check within which temperature period TP a temperature of the memory system 100 falls among the plurality of temperature periods TP that has been set. Information on the plurality of temperature periods TP may be set in advance during a manufacturing process of the memory system 100 or stored as separate setting information. The number of the plurality of temperature periods TP and a range of each temperature period TP may be arbitrarily determined.

In some implementations, a temperature of the memory system 100 may be determined as an average of temperatures measured at the plurality of memory dies DIE, respectively. In some other implementations, a temperature of the memory system 100 may be determined as a temperature of a specific module or region included in the memory system 100.

In some implementations, the memory system 100 may measure a temperature of the memory system 100 using at least one temperature sensor.

For each of the plurality of temperature periods TP that has been set in advance, the memory controller 120 may manage the state check page SC_PG corresponding to a temperature period TP. The state check page may be included in the state check memory block SC_BLK described above with reference to FIG. 5. Referring to FIG. 6, the state check memory block SC_BLK includes multiple state check pages corresponding to temperature periods, respectively. The state check page SC_PG may be used to check a state of data stored in the first memory die DIE_1 in a temperature period TP corresponding to the corresponding state check page SC_PG.

In some implementations, for each of the plurality of temperature periods TP that has been set in advance, the memory controller 120 may manage the program memory block list PGM_BLK_LIST which indicates information on memory blocks programmed with data when a temperature of the memory system 100 falls within a corresponding temperature period TP.

The program memory block list PGM_BLK_LIST may indicate to which memory blocks data are programmed among the memory blocks included in the first memory die DIE_1 when a temperature of the memory system 100 falls within a temperature period TP corresponding to the corresponding program memory block list PGM_BLK_LIST. The memory controller 120 may sequentially access information on memory blocks stored in the program memory block list PGM_BLK_LIST, according to an order in which the information is arranged.

In some implementations, the program memory block list PGM_BLK_LIST may be implemented through various data structures such as a linked list, a circular list, an array, or others.

Figure 7:
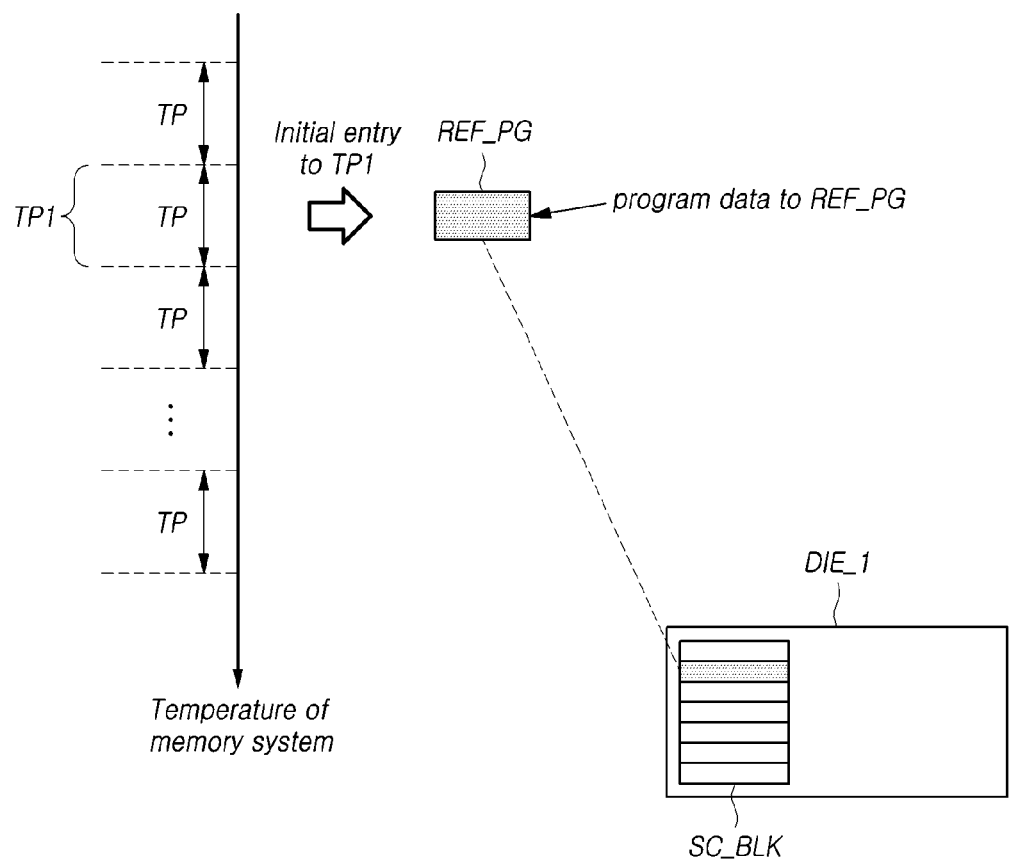
FIG. 7 is a diagram illustrating an operation that is performed by a memory system when a temperature of the memory system has initially entered a first temperature period based on an embodiment of the disclosed technology.

FIG. 7 is a diagram illustrating an example of an operation that is performed by a memory system 100 when a temperature of the memory system 100 has initially entered a first temperature period TP1 based on an embodiment of the disclosed technology.

Referring to FIG. 7, when determining that a temperature of the memory system 100 has initially entered the first temperature period TP1 among the plurality of temperature periods TP, the memory controller 120 of the memory system 100 may program data to a reference page REF_PG that is a state check page corresponding to the first temperature period TP1 and included in the state check memory block SC_BLK for the first memory die DIE_1.

The reference page REF_PG is a state check page which is used to determine states of memory blocks programmed with data when a temperature of the memory system 100 falls within the first temperature period TP1.

Hereinafter, a detailed method in which the memory system 100 programs data to the above-described reference page REF_PG will be described.

Figure 8:
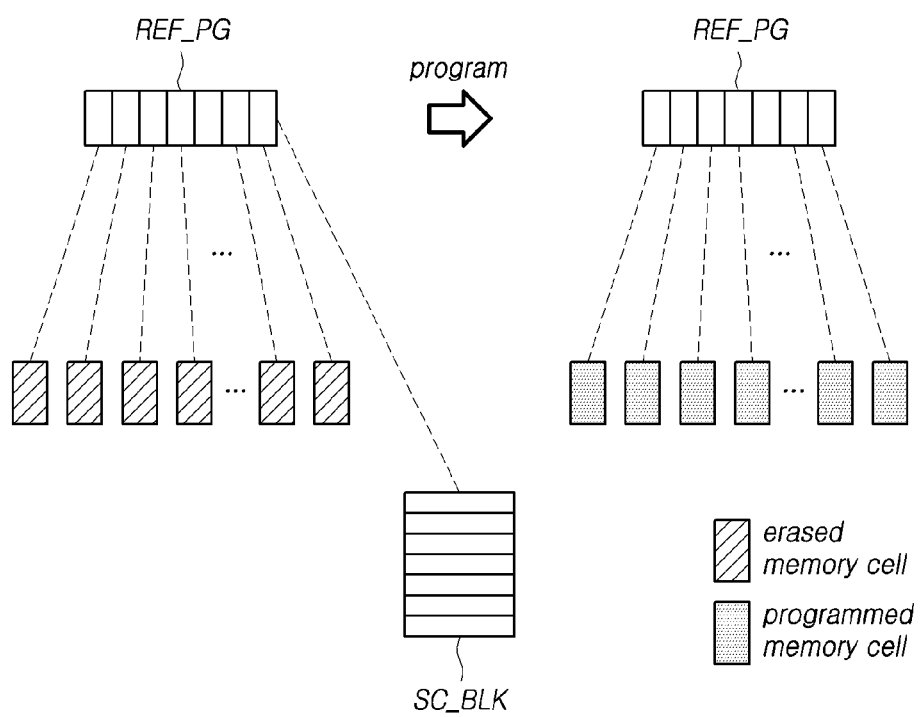
FIG. 8 is a diagram illustrating an example of an operation of programing data to a reference page based on an embodiment of the disclosed technology.

FIG. 8 is a diagram illustrating an example of an operation for programming data to the reference page REF_PG based on an embodiment of the disclosed technology.

Referring to FIG. 8, when programming data to the reference page REF_PG, the memory controller 120 of the memory system 100 may program the data to the reference page REF_PG such that no memory cell in an erased state exists among memory cells corresponding to the reference page REF_PG. Thus, when there is no error occurred to the memory cells of the reference page REF_PG, a number of memory cell that is in an erased state is zero.

The state check memory block SC_BLK includes a plurality of memory cells, and some of the plurality of memory cells may correspond to the reference page REF_PG. Depending on a type of the memory cells included in the state check memory block SC_BLK, the number of memory cells corresponding to the reference page REF_PG may vary. For example, when a storage capacity of the reference page REF_PG is 4 KB and a type of each memory cell included in the state check memory block SC_BLK is SLC, the number of memory cells corresponding to the reference page REF_PG may be 4K*8/1=32K. In another example, when a storage capacity of the reference page REF_PG is 4 KB and a type of each memory cell included in the state check memory block SC_BLK is QLC, the number of memory cells corresponding to the reference page REF_PG may be 4K*8/4=8K.

Before the memory controller 120 programs data to the reference page REF_PG, all the memory cells corresponding to the reference page REF_PG are in an erased state. When programming data to the reference page REF_PG, in order to ensure that no memory cell in an erased state exists among the memory cells corresponding to the reference page REF_PG, the memory controller 120 may set the data to be programmed to the reference page REF_PG such that data to be stored in each memory cell has a certain value (e.g., 110 or 010) other than a value (e.g., 111) indicating an erased state.

The programming of the data to the memory cells corresponding to the reference page REF_PG may be implemented in other ways. In some implementations, the memory controller 120 may program data having the same value to all the memory cells corresponding to the reference page REF_PG.

Hereinafter, a method for determining whether a temperature of the memory system 100 has initially entered the first temperature period TP1 will be described.

Figure 9:
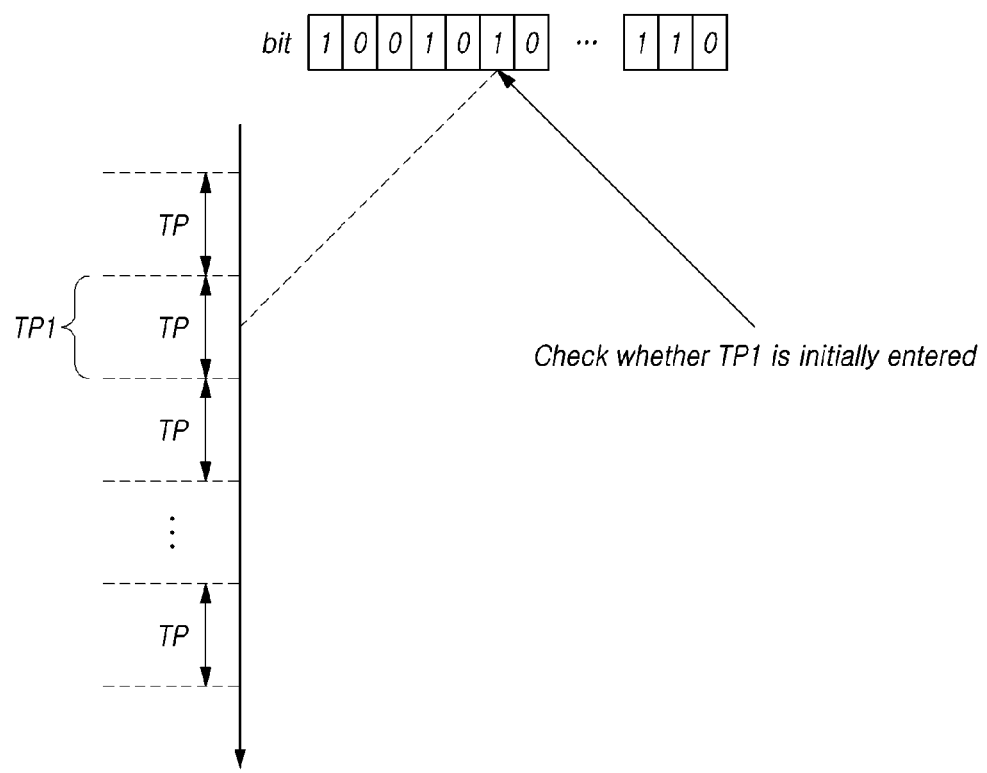
FIG. 9 is a diagram illustrating an example of an operation of determining whether a temperature of the memory system has initially entered a first temperature period based on an embodiment of the disclosed technology.

FIG. 9 is a diagram illustrating an example of an operation for determining whether a temperature of the memory system 100 has initially entered the first temperature period TP1 based on some implementations of the disclosed technology.

Referring to FIG. 9, the memory controller 120 of the memory system 100 may determine whether a temperature of the memory system 100 has initially entered the first temperature period TP1, based on a value of a bit indicating whether the reference page REF_PG has been generated.

In FIG. 9, for the respective temperature periods TP, the memory controller 120 may manage corresponding bits indicating whether a temperature of the memory system 100 has ever entered the respective temperature periods TP. When a corresponding bit has a first value (e.g., 0), the corresponding bit indicates that a temperature of the memory system 100 has never entered a certain temperature period TP corresponding to the corresponding bit. When a corresponding bit has a second value (e.g., 1), the corresponding bit indicates that a temperature of the memory system 100 has already entered a temperature period TP corresponding to the corresponding bit.

In this case, when a temperature of the memory system 100 enters the first temperature period TP1, if a bit corresponding to the first temperature period TP1 has the first value, the memory controller 120 determines that the temperature of the memory system 100 has initially entered the first temperature period TP1. If the bit corresponding to the first temperature period TP1 has the second value, the memory controller 120 determines that the temperature of the memory system 100 has previously entered the first temperature period TP1.

When a temperature of the memory system 100 enters a specific temperature period TP among the plurality of temperature periods TP, the memory controller 120 may change a value of a corresponding bit to the specific temperature period TP from the first value to the second value. The change of a bit corresponding to the specific temperature period TP from the first value to the second value can be used as a record that a temperature of the memory system 100 has initially entered the corresponding temperature period TP. As discussed above, the memory system 100 programs data to memory cells included in a state check page corresponding to a specific temperature period upon determining that a temperature of the memory system 100 has initially entered the specific temperature period.

Next, a method for the memory system 100 to determine a location of the reference page REF_PG in the state check memory block SC_BLK will be described.

Figure 10:
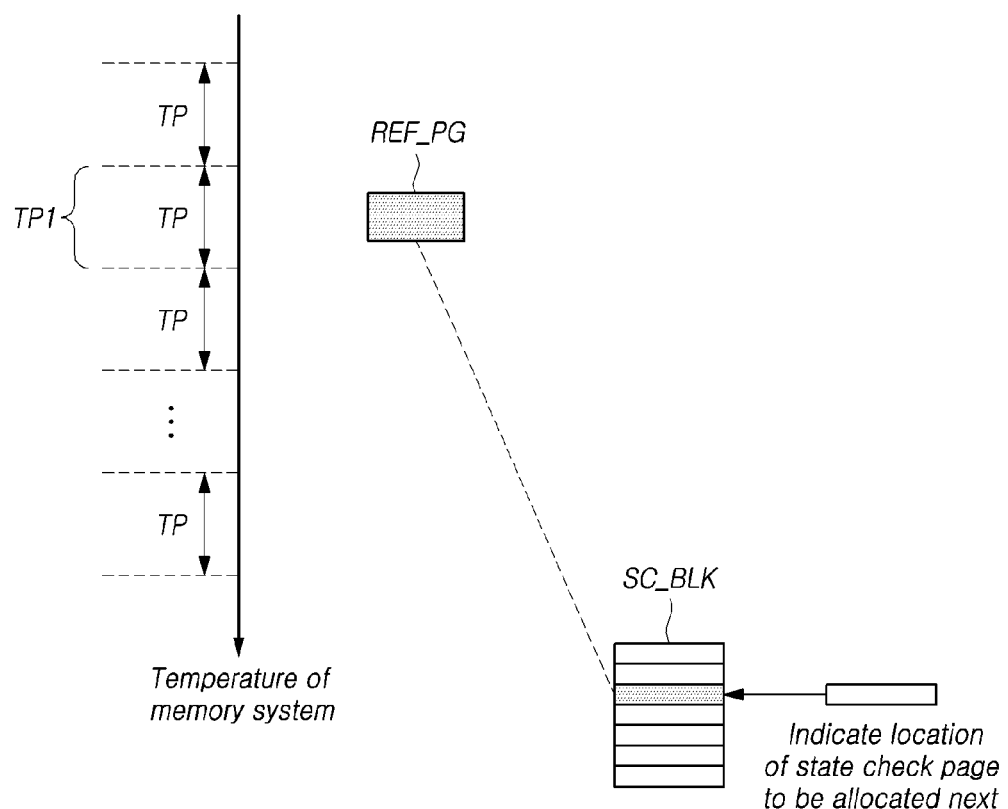
FIG. 10 is a diagram illustrating an example of an operation of determining a location of a reference page based on an embodiment of the disclosed technology.

FIG. 10 is a diagram illustrating an example of an operation in which a memory system 100 determines a location of the reference page REF_PG based on an embodiment of the disclosed technology.

Referring to FIG. 10, the memory controller 120 of the memory system 100 may determine the reference page REF_PG, based on information indicating a location of a state check page to be allocated to any one of the plurality of temperature periods TP in the state check memory block SC_BLK. For example, the memory controller 120 may obtain the information by searching for page which is not allocated yet to any one of the plurality of temperature periods TP in the status check memory block SC_BLK. For another example, the memory controller 120 may obtain the information by searching for page which is i) not allocated yet to any one of the plurality of temperature periods TP and 2) adjacent to the state check page corresponding to the temperature period to which the temperature of the memory system 100 currently belongs.

Each of state check pages included in the state check memory block SC_BLK may be either a state check page that has already allocated to any one of the plurality of temperature periods TP or a state check page that has not allocated yet to any one of the plurality of temperature periods TP. When a temperature of the memory system 100 initially enters the first temperature period TP1, the memory controller 120 may select a state check page to be allocated to the first temperature period TP1, among state check pages each not allocated yet to any one of the plurality of temperature periods TP.

To this end, the memory controller 120 may determine a location of the reference page REF_PG based on information indicating a location of a state check page that is included in the state check memory block SC_BLK and to be next allocated to any one of the plurality of temperature periods TP, and may determine the reference page REF_PG at the corresponding location. Thus, the reference page REF_PG at the corresponding location becomes a state check page corresponding to the first temperature period TP1.

Since the reference page REF_PG has been allocated to the first temperature period TP1, the memory controller 120 may update information indicating a location of a state check page to be next allocated to any one of the plurality of temperature periods TP. The updated information indicates one or more state check pages not allocated yet to any one of the plurality of temperature periods TP.

In the above, the reference page REF_PG as a state check page corresponding to the first temperature period TP1 has been described.

Hereinafter, a method of managing a first program memory block list PGM_BLK_LIST1 will be explained.

The first program memory block list PGM_BLK_LIST1 refers to a program memory block list PGM_BLK_LIST that is one of the program memory block lists PGM_BLK_LIST shown in FIG. 6 and corresponds to the first temperature period TP1.

Figure 11:
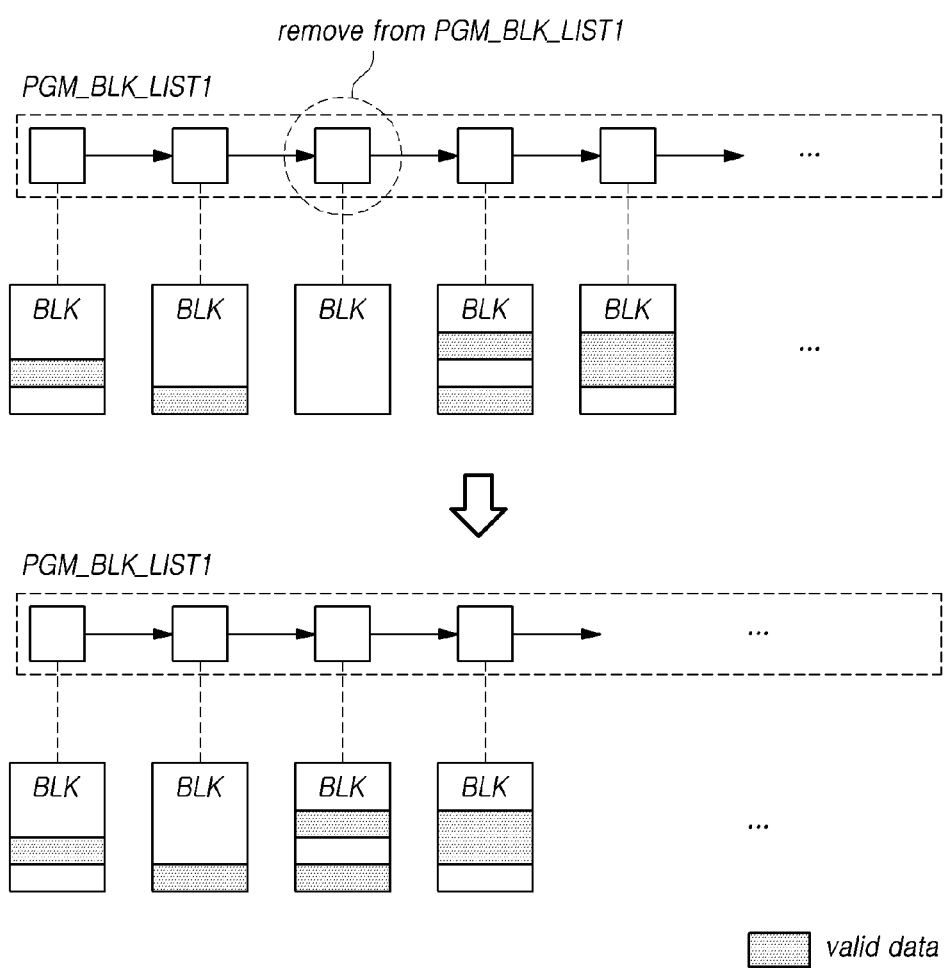
FIGS. 11 and 12 are diagrams illustrating an example of an operation of managing a first program memory block list based on an embodiment of the disclosed technology.
Figure 12:
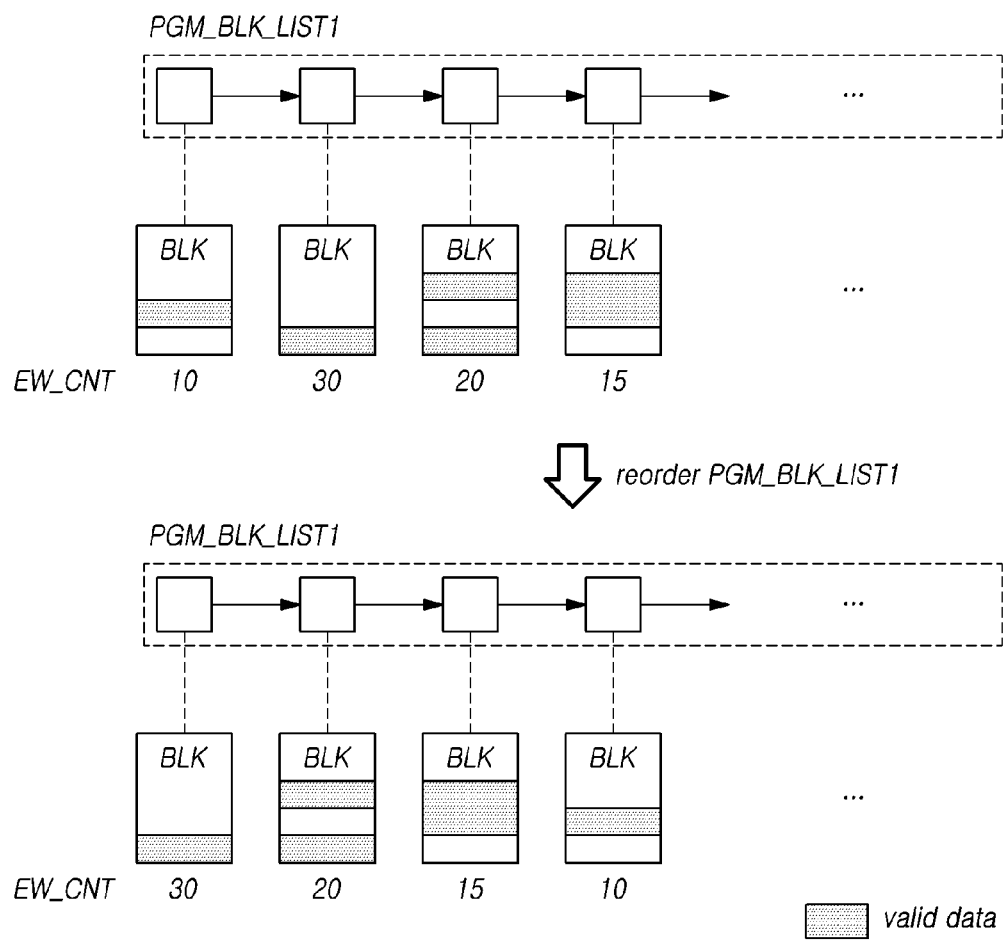

FIGS. 11 and 12 are diagrams illustrating an example of an operation for managing the first program memory block list PGM_BLK_LIST1 as the program memory block list PGM_BLK_LIST corresponding to the first temperature period TP1 based on an embodiment of the disclosed technology.

Referring to FIG. 11, the first program memory block list PGM_BLK_LIST1 includes information on memory blocks BLK programmed with data when a temperature of the memory system 100 falls within the first temperature period TP1.

Among the memory blocks BLK programmed with data when a temperature of the memory system 100 falls within the first temperature period TP1, there may exist a memory block in which valid data is stored and there may exist a memory block in which no valid data is stored. For example, if valid data is programmed to any one memory block when a temperature of the memory system 100 falls within the first temperature period TP1 and then an erase operation or a garbage collection operation for the corresponding memory block is executed, valid data may no longer exist in the corresponding memory block.

The memory controller 120 of the memory system 100 may remove information on a memory block in which valid data is not stored, in the first program memory block list PGM_BLK_LIST1. This is because an error occurred in invalid data does not need to be corrected.

Referring to FIG. 12, the first program memory block list PGM_BLK_LIST1 includes information on memory blocks BLK programmed with valid data among memory blocks BLK programmed with data when a temperature of the memory system 100 falls within the first temperature period TP1.

The memory controller 120 of the memory system 100 may rearrange the information on the memory blocks BLK, included in the first program memory block list PGM_BLK_LIST1, depending on a value of an erase/program count EW_CNT of each memory block BLK. In FIG. 12, an operation in which the memory controller 120 rearranges the information on the memory blocks BLK, included in the first program memory block list PGM_BLK_LIST1, in a descending order with respect to a value of the erase/program count EW_CNT will be described as an example. The erase/program count corresponds to a number of times that an erase operation or a program operation is performed to a memory block.

For example, it is assumed that the first program memory block list PGM_BLK_LIST1 includes information on memory blocks having erase/program counts EW_CNT of 10, 30, 20 and 15, respectively.

The memory controller 120 may rearrange the information on the memory blocks BLK included in the first program memory block list PGM_BLK_LIST1 such that the information on a memory block BLK whose value of the erase/program count EW_CNT is largest as 30 is positioned foremost, the information on a memory block BLK whose value of the erase/program count EW_CNT is 20 is positioned next, the information on a memory block BLK whose value of the erase/program count EW_CNT is 15 is positioned next and the information on a memory block BLK whose value of the erase/program count EW_CNT is 10 is positioned next.

Thereafter, the memory controller 120 may check states of the memory blocks BLK, indicated by the first program memory block list PGM_BLK_LIST1, according to an order in which pieces of the information on the memory blocks BLK are arranged. The memory controller 120 may first check a state of the memory block BLK whose value of the erase/program count EW_CNT is greatest as 30, then check a state of the memory block BLK whose value of the erase/program count EW_CNT is 20, then check a state of the memory block BLK whose value of the erase/program count EW_CNT is 15, and then check a state of the memory block BLK whose value of the erase/program count EW_CNT is 10.

In some implementations, unlike the rearrangement method described above with reference to FIG. 12, the memory controller 120 may rearrange the information on the memory blocks BLK, included in the first program memory block list PGM_BLK_LIST1, in an ascending order with respect to a value of the erase/program count EW_CNT.

In the above, a method of managing the reference page REF_PG and the first program memory block list PGM_BLK_LIST1 has been described.

Hereinafter, a method of checking states of data stored in the memory blocks BLK included in the first memory die DIE_1 when a temperature of the memory system 100 falls within the first temperature period TP1 will be described.

Figure 13:
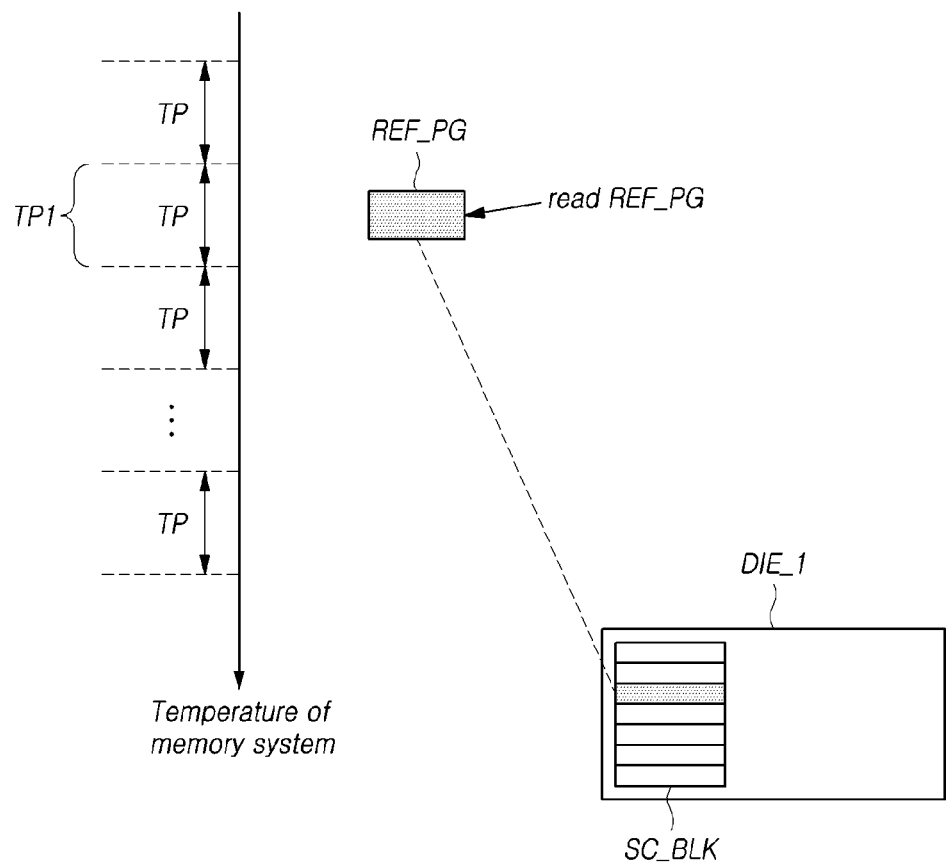
FIG. 13 is a diagram illustrating an example of an operation of reading data stored in a reference page based on an embodiment of the disclosed technology.

FIG. 13 is a diagram illustrating an example of an operation that a memory system 100 reads data stored in the reference page REF_PG based on an embodiment of the disclosed technology.

Referring to FIG. 13, when a temperature of the memory system 100 falls within the first temperature period TP1, in order to check states of data stored in the memory blocks included in the first memory die DIE_1, the memory controller 120 of the memory system 100 may read data stored in the reference page REF_PG included in the state check memory block SC_BLK.

As described above, the data stored in the reference page REF_PG is data programmed when a temperature of the memory system 100 initially enters the first temperature period TP1. In some implementations, based on a state of the data stored in the reference page REF_PG, the memory controller 120 can predict a general state of data programmed to the first memory die DIE_1 when a temperature of the memory system 100 is in the first temperature period TP1.

Figure 14:
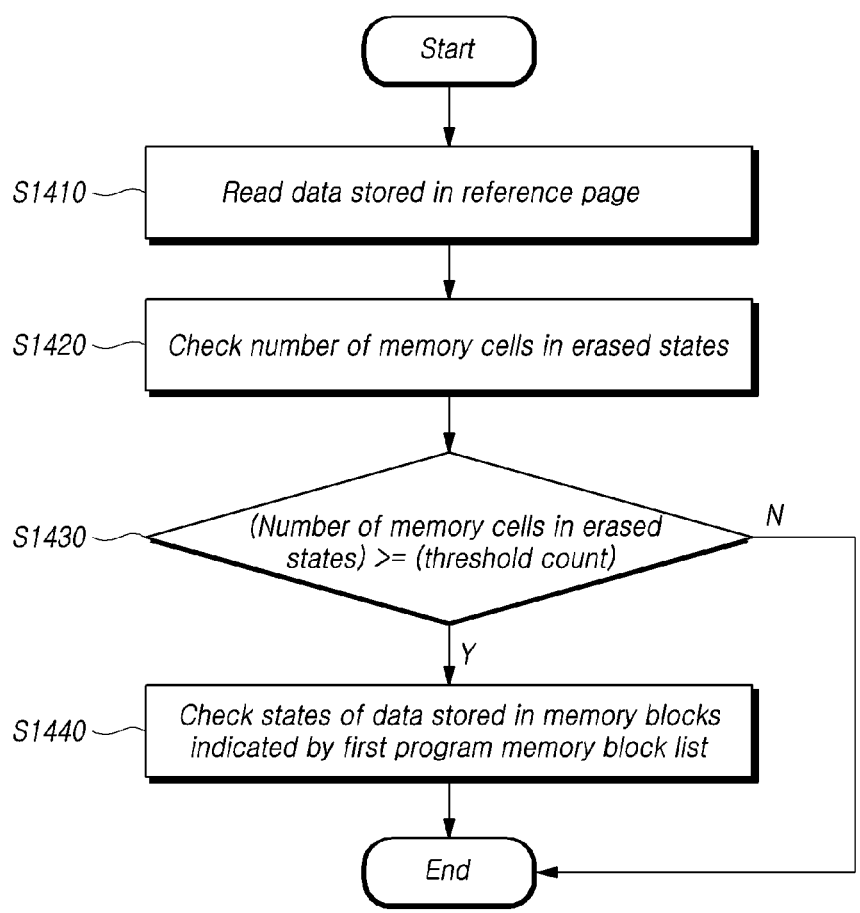
FIG. 14 is a flow chart showing an example of an operation of determining whether to check states of data stored in memory blocks based on an embodiment of the disclosed technology.

FIG. 14 is a flow chart showing an example of an operation for determining whether to check states of data stored in memory blocks based on an embodiment of the disclosed technology.

Referring to FIG. 14, the memory controller 120 of the memory system 100 may read data stored in the reference page REF_PG (S1410).

At the operation S1410, the data stored in the reference page REF_PG is read. Based on a result of reading the data stored in the reference page REF_PG at the operation S1410, the memory controller 120 determines the number of memory cells that are in erased states and corresponds to the reference page REF_PG (S1420). For example, by dividing the data, which is read at the operation S1410, into data units corresponding to memory cells, and then counting the number of data units each having a value corresponding to an erased state among the data units, the memory controller 120 may determine the number of memory cells in erased states.

The memory controller 120 determines whether the number of memory cells in erased states is equal to or greater than a preset threshold count (S1430).

When the number of memory cells in erased states is equal to or greater than the preset threshold count (S1430-Y), the memory controller 120 may check states of data stored in memory blocks indicated by the first program memory block list PGM_BLK_LIST1 as the program memory block list PGM_BLK_LIST corresponding to the first temperature period TP1 (S1440). The fact that a memory block is indicated by the first program memory block list PGM_BLK_LIST1 means that information indicating the corresponding memory block is included in the first program memory block list PGM_BLK_LIST1.

On the other hand, when the number of memory cells in erased states is less than the preset threshold count (S1430-N), the memory controller 120 may not execute the operation of checking states of data stored in the memory blocks whose information is indicated by the first program memory block list PGM_BLK_LIST1.

When a temperature of the memory system 100 is in the first temperature period TP1, the memory controller 120 programs data to the reference page REF_PG such that no memory cell in an erased state exists among the memory cells corresponding to the reference page REF_PG. Thus, the fact that a memory cell in an erased state is detected among the memory cells corresponding to the reference page REF_PG means that an error has occurred in data programmed to the first memory die DIE_1 in the first temperature period TP1.

If the number of memory cells in erased states among the memory cells corresponding to the reference page REF_PG is equal to or greater than the threshold count, it may also be regarded that there is a high possibility for an error to occur in the data, programmed to the first memory die DIE_1, when a temperature of the memory system 100 falls within the first temperature period TP1. Therefore, by checking a state of the data, programmed to the first memory die DIE_1, when a temperature of the memory system 100 falls within the first temperature period TP1, the memory controller 120 may prevent a problem that the reliability of the data programmed to the first memory die DIE_1 is degraded due to a change in the temperature of the memory system 100.

Figure 15:
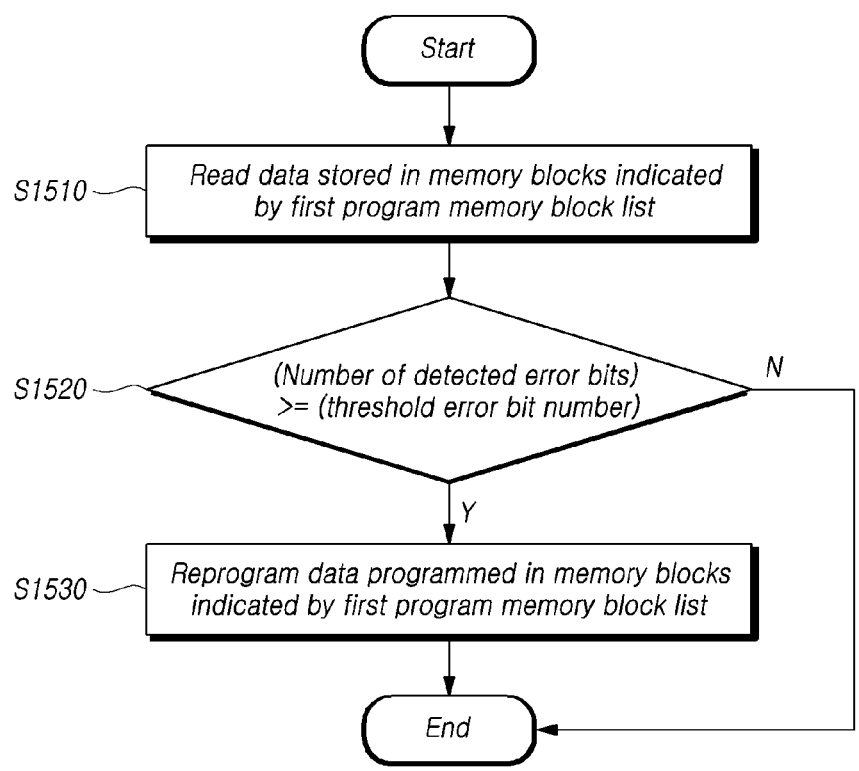
FIG. 15 is a flow chart showing an example of an operation of determining whether to reprogram data stored in memory blocks based on an embodiment of the disclosed technology.

FIG. 15 is a flow chart showing an example of an operation for determining whether to reprogram data stored in memory blocks based on an embodiment of the disclosed technology.

Referring to FIG. 15, the memory controller 120 of the memory system 100 reads data stored in the memory blocks indicated by the first program memory block list PGM_BLK_LIST1 that is the program memory block list PGM_BLK_LIST corresponding to the first temperature period TP1 (S1510).

Based on the data read at the operation S1510, the memory controller 120 determines whether the number of error bits detected in the memory blocks whose information is indicated by the first program memory block list PGM_BLK_LIST1 corresponding to the first temperature period TP1 is equal to or greater than a preset threshold error bit number (S1520). The number of error bits by a UECC may also be included in the number of detected error bits.

When the number of detected error bits is equal to or greater than the preset threshold error bit number (S1520-Y), the memory controller 120 may reprogram the data programmed to the memory blocks indicated by the first program memory block list PGM_BLK_LIST1 (S1530). For example, in order to execute a reprogram operation, the memory controller 120 may execute garbage collection on the memory blocks indicated by the first program memory block list PGM_BLK_LIST1 corresponding to the first temperature period TP1.

On the other hand, when the number of detected error bits is less than the preset threshold error bit number (S1520-N), the memory controller 120 may omit the operation of reprogramming the data programmed to the memory blocks indicated by the first program memory block list PGM_BLK_LIST1.

Figure 16:
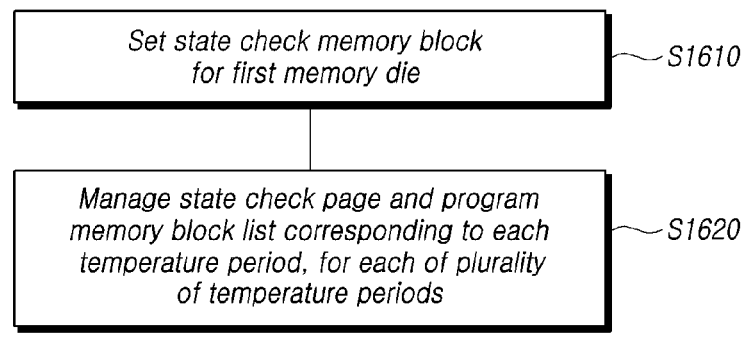
FIG. 16 is a diagram showing a method for operating a memory system based on an embodiment of the disclosed technology.

FIG. 16 is a diagram showing a method for operating a memory system 100 based on an embodiment of the disclosed technology.

Referring to FIG. 16, for the first memory die DIE_1 among the plurality of memory dies DIE included in the memory device 110, the method for operating the memory system 100 may include operation S1610 of setting, among the plurality of memory blocks BLK included in the first memory die DIE_1, the state check memory block SC_BLK as a memory block used to check states of data stored in memory blocks BLK included in the first memory die DIE_1.

In addition, the method for operating the memory system 100 may include operation S1620 of managing, for each of the plurality of temperature periods TP set, the state check page SC_PG corresponding to each temperature period TP in the state check memory block SC_BLK and the program memory block list PGM_BLK_LIST indicating information on memory blocks BLK programmed with data when a temperature of the memory system 100 falls within each temperature period TP.

FIG. 17 is a diagram showing an example of the operation S1620 of managing a state check page and a program memory block list for each of a plurality of temperature periods.

Referring to FIG. 17, the operation S1620 of managing a state check page and a program memory block list for each of a plurality of temperature periods may include operation S1710 of determining whether a temperature of the memory system 100 has initially entered the first temperature period TP1 among the plurality of temperature periods TP.

Also, the operation S1620 of managing a state check page and a program memory block list for each of a plurality of temperature periods may include operation S1720 of, in order to check states of memory blocks programmed with data when a temperature of the memory system 100 falls within the first temperature period TP1, programming data in the reference page REF_PG as a state check page corresponding to the first temperature period TP1 in the state check memory block SC_BLK. At this time, data is programmed such that no memory cell in an erased state exists among memory cells corresponding to the reference page REF_PG.

The operation S1710 of determining whether a temperature of the memory system 100 has initially entered the first temperature period TP1 among the plurality of temperature periods TP may determine whether a temperature of the memory system 100 has initially entered the first temperature period TP1, for example, based on a value of a bit indicating whether the reference page REF_PG has been generated.

The reference page REF_PG in the state check memory block SC_BLK may be determined, for example, based on information indicating a location of a state check page to be next allocated to any one of the plurality of temperature periods PT in the state check memory block SC_BLK.

The operation S1620 of managing a state check page and a program memory block list for each of a plurality of temperature periods may further include, in addition to the operation S1710 and the operation S1720, operation of removing information on a memory block in which valid data is not stored, from the first program memory block list PGM_BLK_LIST1 as the program memory block list PGM_BLK_LIST corresponding to the first temperature period TP1. In this case, the operation S1620 may further include operation of rearranging information on the memory blocks included in the first program memory block list PGM_BLK_LIST1, depending on a value of an erase/program count of each memory block.

In some implementations, the operation S1620 of managing a state check page and a program memory block list for each of a plurality of temperature periods may further include operation of, when a temperature of the memory system 100 falls within the first temperature period TP1, in order to check states of data stored in the memory blocks included in the first memory die DIE_1, reading data stored in the reference page REF_PG in the state check memory block SC_BLK.

The operation S1620 may further include operation of, when it is determined that the number of memory cells in erased states among the memory cells corresponding to the reference page REF_PG is equal to or greater than the preset threshold count, checking states of data stored in the memory blocks indicated by the first program memory block list PGM_BLK_LIST1 as the program memory block list PGM_BLK_LIST corresponding to the first temperature period TP1.

The operation S1620 may further include operation of, when the number of error bits detected in the memory blocks indicated by the first program memory block list PGM_BLK_LIST1 is equal to or greater than the threshold error bit number, reprogramming data programmed to the memory blocks indicated by the first program memory block list PGM_BLK_LIST1.

Figure 18:
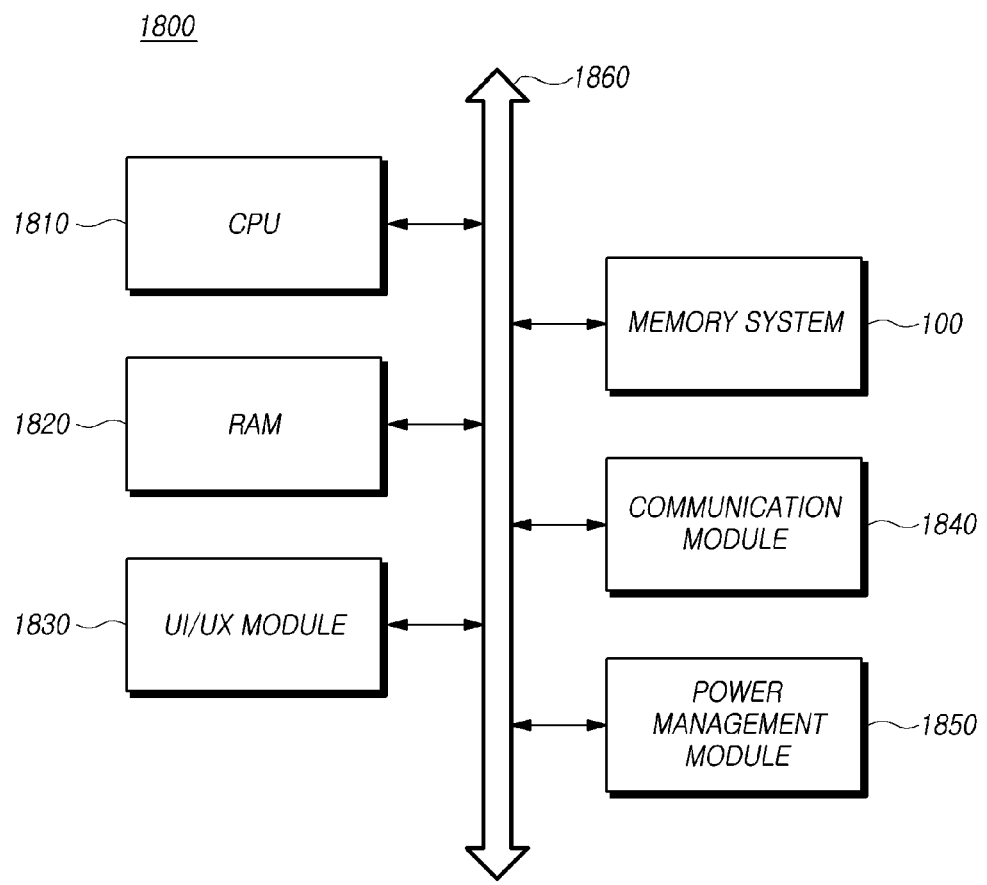
FIG. 18 is a diagram illustrating the configuration of a computing system based on some embodiments of the disclosed technology.

FIG. 18 is a diagram illustrating the configuration of a computing system 1800 based on an embodiment of the disclosed technology.

Referring to FIG. 18, the computing system 1800 based on an embodiment of the disclosed technology may include: a memory system 100 electrically connected to a system bus 1860; a CPU 1810 configured to control the overall operation of the computing system 1800; a RAM 1820 configured to store data and information related to operations of the computing system 1800; a user interface/user experience (UI/UX) module 1830 configured to provide the user with a user environment; a communication module 1840 configured to communicate with an external device as a wired and/or wireless type; and a power management module 1850 configured to manage power used by the computing system 1800.

The computing system 1800 may be a personal computer (PC) or may include a mobile terminal such as a smartphone, a tablet or various electronic devices.

The computing system 1800 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system can be advantageously reduced or minimized. In addition, based on an embodiment of the disclosed technology, an overhead occurring in the process of calling a specific function can be advantageously reduced or minimized.

Although various embodiments of the disclosed technology have been described with particular specifics and varying details for illustrative purposes, various modifications, additions and substitutions of the disclosed embodiments and other embodiments may be made based on what is disclosed or illustrated in this patent document.

What is claimed is:

1. A memory system, comprising: a memory device including a plurality of memory dies, each memory die including a plurality of memory blocks configured to store data; and a memory controller coupled to communicate with the memory device and configured to control the memory device and check within which temperature period the memory system falls among a plurality of temperature periods that is predetermined and includes a first temperature period and a second temperature period, wherein the memory controller is further configured to select, for a first memory die included in the plurality of memory dies, a state check memory block among memory blocks included in the first memory die based on probabilities that an error occurs in the data stored in the memory blocks included in the first memory die, the state check memory block having a higher possibility that an error occurs than other memory blocks included in the first memory die, the state check memory block including state check pages including a first state check page and a second state check page that correspond to the first temperature period and the second temperature period, respectively, wherein the memory controller is further configured to make a determination that the memory system falls within the first temperature period, and program, in response to the determination, second data to the first state check page corresponding to the first temperature period among the plurality of temperature periods, wherein the memory controller is further configured to access information on memory blocks stored in a program memory block list which is a linked list indicating that to which memory blocks, among the memory blocks included in the first memory die, the data is programmed at a time that a temperature of the memory system falls within the first temperature period, and wherein the memory controller sequentially accesses the information on the memory blocks arranged in the program memory block list according to an order in which the information is arranged.

2. The memory system according to claim 1, wherein the determination determines that the temperature of the memory system has initially entered the first temperature period, and the second data is programmed in the first state check page, and wherein the first state check page is free of a memory cell that is in an erased state.

3. The memory system according to claim 2, wherein the memory controller is further configured to determine whether the temperature of the memory system has entered the first temperature period based on a value of a bit indicating whether the first state check page has been generated.

4. The memory system according to claim 2, wherein the memory controller is further configured to determine the first state check page included in the state check memory block based on information indicating a location of another state check page to be allocated to another temperature period of the plurality of temperature periods.

5. The memory system according to claim 2, wherein the memory controller is further configured to remove information on a memory block in which valid data is not stored from the program memory block list.

6. The memory system according to claim 5, wherein the memory controller is further configured to rearrange information on certain memory blocks included in the program memory block list depending on a value of a count that an erase operation or a program has been performed on each memory block.

7. The memory system according to claim 2, wherein the memory controller is further configured to read the second data stored in the first state check page in the state check memory block to determine the state of certain memory blocks when the temperature of the memory system falls within the first temperature period.

8. The memory system according to claim 7, wherein the memory controller is configured to check the data stored in the certain memory blocks indicated by the program memory block list in case that the state check memory block includes a number of memory cells in erased states that is equal to or greater than a preset threshold count.

9. The memory system according to claim 8, wherein the memory controller is further configured to reprogram the data programmed to the certain memory blocks indicated by the program memory block list in case that a number of error bits detected in the certain memory blocks is equal to or greater than a threshold number.

10. A method for operating a memory system including a memory device, the method comprising: selecting, for a first memory die that is one of a plurality of memory dies included in the memory device, a state check memory block among memory blocks included in the first memory die based on probabilities that an error occurs in data stored in the memory blocks included in the first memory die, the state check memory block having a higher possibility that an error occurs than other memory blocks included in the first memory die, the state check memory block including state check pages corresponding to a plurality of temperature periods, respectively, the state check pages including a first state check page and a second state check page that respectively correspond to the first temperature period and the second temperature period that are included in the plurality of temperature periods, and each memory die including a plurality of memory blocks configured to store the data; determining that the memory system falls within the first temperature period, and programming, in response to the determining, second data to the first state check page corresponding to the first temperature period among the plurality of temperature periods; and accessing information on memory blocks stored in a program memory block list which is a linked list indicating that to which memory blocks, among the memory blocks included in the first memory die, the data is programmed at a time that a temperature of the memory system falls within the first temperature period, and wherein the information on the memory blocks arranged in the program memory block list sequentially accessed according to an order in which the information is arranged.

11. The method according to claim 10, wherein the determining determines whether the temperature of the memory system has initially entered the first temperature period; and the programming programs the second data in the first state check page, and wherein the first state check page is free of a memory cell that is in an erased state.

12. The method according to claim 11, wherein the determining is performed based on a value of a bit indicating whether the first state check page has been generated.

13. The method according to claim 11, wherein the first state check page is determined based on information indicating a location of another state check page to be allocated to another temperature period of the plurality of temperature periods.

14. The method according to claim 11, further comprising:
removing information on a memory block in which valid data is not stored from the program memory block list.

15. The method according to claim 14, further comprising:
rearranging information on certain memory blocks included in the program memory block list depending on a count that an erase operation or a program operation has been performed on each memory block.

16. The method according to claim 11, further comprising: reading the second data stored in the first state check page in the state check memory block to determine the state of certain memory blocks when the temperature of the memory system falls within the first temperature period.

17. The method according to claim 16, further comprising: checking the data stored in the certain memory blocks indicated by the program memory block list in case that the state check memory block includes a number of memory cells in erased states that is equal to or greater than a present threshold count.

18. The method according to claim 17, further comprising:
reprogramming the data programmed to the certain memory blocks indicated by the program memory block list in case that a number of error bits detected in the certain memory blocks is equal to or greater than a threshold number.

* * * * *